United States Patent
Kijima et al.

(10) Patent No.: US 9,486,834 B2
(45) Date of Patent: Nov. 8, 2016

(54) FERROELECTRIC FILM AND METHOD FOR MANUFACTURING THE SAME

(75) Inventors: Takeshi Kijima, Chiba (JP); Yuuji Honda, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 117 days.

(21) Appl. No.: 14/235,626

(22) PCT Filed: Jul. 29, 2011

(86) PCT No.: PCT/JP2011/067437
§ 371 (c)(1),
(2), (4) Date: Apr. 4, 2014

(87) PCT Pub. No.: WO2013/018155
PCT Pub. Date: Feb. 7, 2013

(65) Prior Publication Data
US 2014/0242379 A1    Aug. 28, 2014

(51) Int. Cl.
*H01L 41/187* (2006.01)
*H01L 41/083* (2006.01)
*H01L 41/318* (2013.01)
*B05D 5/00* (2006.01)
*H01L 41/08* (2006.01)

(52) U.S. Cl.
CPC ............. *B05D 5/00* (2013.01); *H01L 41/0815* (2013.01); *H01L 41/1873* (2013.01); *H01L 41/1878* (2013.01); *H01L 41/318* (2013.01); *Y10T 428/26* (2015.01)

(58) Field of Classification Search
None
See application file for complete search history.

(56) References Cited

U.S. PATENT DOCUMENTS

| | | | | |
|---|---|---|---|---|
| 6,093,338 A | * | 7/2000 | Tani | C04B 35/462 252/62.9 PZ |
| 2006/0091588 A1 | * | 5/2006 | Nakamura | C04B 35/495 264/672 |
| 2006/0198599 A1 | * | 9/2006 | Higuchi | C30B 23/025 385/147 |
| 2006/0222895 A1 | * | 10/2006 | Higuchi | H01L 41/0815 428/701 |
| 2007/0126313 A1 | * | 6/2007 | Ueno | H03H 9/02031 310/311 |
| 2009/0096328 A1 | * | 4/2009 | Shibata | H01L 41/094 310/346 |

(Continued)

FOREIGN PATENT DOCUMENTS

| | | |
|---|---|---|
| JP | 2003-273706 | 9/2003 |
| JP | 2009-117785 | 5/2009 |
| JP | 2010-67756 | 3/2010 |
| JP | 2011-46129 | 3/2011 |
| JP | 2011-146623 | 7/2011 |
| WO | 2006/087777 | 8/2006 |

OTHER PUBLICATIONS

International Search Report issued Aug. 30, 2011 in International Application No. PCT/JP2011/067437.

*Primary Examiner* — David Sample
(74) *Attorney, Agent, or Firm* — Wenderoth, Lind & Ponack, L.L.P.

(57) ABSTRACT

To produce a ferroelectric film formed of a lead-free material. The ferroelectric film according to an aspect of the present invention includes a $(K_{1-x}Na_x)NbO_3$ film or a $BiFeO_3$ film having a perovskite structure and a crystalline oxide preferentially oriented to (001) formed on at least one of the upper side and lower side of the $(K_{1-x}Na_x)NbO_3$ film or $BiFeO_3$ film, and X satisfies the formula below $$0.3 \le X \le 0.7.$$

15 Claims, 3 Drawing Sheets

(56) References Cited

U.S. PATENT DOCUMENTS

| | | | |
|---|---|---|---|
| 2009/0189482 A1* | 7/2009 | Shibata | G01C 19/5663 310/311 |
| 2009/0280355 A1* | 11/2009 | Eom | C30B 29/24 428/701 |
| 2011/0050811 A1* | 3/2011 | Wang | B41J 2/055 347/71 |
| 2012/0038714 A1* | 2/2012 | Harigai | B41J 2/14032 347/71 |
| 2014/0145555 A1* | 5/2014 | Kurachi | A61B 5/02444 310/311 |

* cited by examiner

BIT(BLT)

FERROELECTRIC FILM AND METHOD FOR MANUFACTURING THE SAME

TECHNICAL FIELD

The present invention relates to a ferroelectric film and a method for manufacturing the same.

BACKGROUND ART

A conventional method for manufacturing a Pb (Zr, Ti) $O_3$ (hereinafter, referred to as "PZT") film will be explained.

On a 4-inch wafer, a Pt film (111)-oriented, for example, is formed, and on the Pt film, a PZT sol-gel solution is spin-coated by a spin coater. Next, the coated PZT sol-gel solution is heated and held on a hot plate to be dried, and the moisture is removed. After that, it is furthermore heated and held on a hot plate kept at higher temperature to be calcined. The repetition of the process a plurality of times generates amorphous PZT.

Next, the amorphous PZT having been calcined is subjected to an annealing treatment by using a pressurizing-type lamp annealing device (RTA: rapidly thermal anneal) and PZT crystallization is performed. The crystallized PZT film has a perovskite structure. (For example, see Patent Document 1)

On the other hand, PZT has the Tc existing at 300° C. or higher, and has good ferroelectric properties and piezoelectric properties, but in circumstances where the whole industrial world aims at making lead free, the problem to be solved is to attain lead-free PZT.

CITATION LIST

Patent Document

[Patent Document 1] WO 2006/087777

DISCLOSURE OF THE INVENTION

Problems to be Solved by the Invention

As described above, in the industrial world, the production of a ferroelectric film formed of a lead-free material is required. An aspect of the present invention aims at producing a ferroelectric film formed of a lead-free material.

Means for Solving the Problems

The following (1) to (17) explain a plurality of aspects of the present invention.

(1) A ferroelectric film including:
a $(K_{1-x}Na_x)NbO_3$ film or a $BiFeO_3$ film having a perovskite structure; and
a crystalline oxide preferentially oriented to (001), formed on at least one of an upper side and lower side of the $(K_{1-x}Na_x)NbO_3$ film or $BiFeO_3$ film, wherein X satisfies the formula below $$0.3 \leq X \leq 0.7.$$

(2) The ferroelectric film according to the above (1), wherein the crystalline oxide is a bismuth layered-structure ferroelectric substance having a pseudo-perovskite structure or a tungsten-bronze type ferroelectric substance.

(3) The ferroelectric film according to the above (1) or (2), wherein the bismuth layered-structure ferroelectric substance is $(Bi_2O_2)^{2+}(A_{m-1}B_mO_{3m+1})^{2-}$ (m=1 to 5) or $Bi_2A_{m-1}B_mO_{3m+3}$ (m=1 to 5).

(4) The ferroelectric film according to the above (2) or (3), wherein the bismuth layered-structure ferroelectric substance is $Bi_4Ti_3O_{12}$ or $(Bi_{4-x}La_x)Ti_3O_{12}$, and x satisfies the formula below $$0<x<1.$$

(5) The ferroelectric film according to any one of the above (1) to (4), wherein the crystalline oxide is formed in an island shape or in a film shape.

(6) The ferroelectric film according to any one of the above (1) to (5), wherein a thickness of the crystalline oxide is 2 to 30 nm.

The thickness of the crystalline oxide referred to here means, when the crystalline oxide is formed only on one of the upper side and lower side of the $(K_{1-x}Na_x)NbO_3$ film or the $BiFeO_3$ film, the thickness thereof, and means, when the crystalline oxide is formed on both the upper side and lower side of the $(K_{1-x}Na_x)NbO_3$ film or the $BiFeO_3$ film, the sum of both thicknesses.

(7) The ferroelectric film according to any one of the above (1) to (6), wherein the $(K_{1-x}Na_x)NbO_3$ film or $BiFeO_3$ film is formed by a sol-gel method.

(8) The ferroelectric film according to any one of the above (1) to (7), wherein a ferroelectric film including the $(K_{1-x}Na_x)NbO_3$ film or $BiFeO_3$ film, and the crystalline oxide formed on at least one of the upper side and lower side thereof is stacked.

(9) A method for manufacturing a ferroelectric film, including the steps of:
forming, by coating a sol-gel solution containing K, Na and Nb on a substrate by a spin-coating method, a coated film on the substrate;
forming, by calcining the coated film, a ferroelectric material film on the substrate;
forming a first material film for forming a crystalline oxide in an island shape or in a film shape on the ferroelectric material film; and
forming, by heat-treating the ferroelectric material film and the first material film for forming a crystalline oxide in an oxygen atmosphere, a ferroelectric film obtained by crystallizing the ferroelectric material film and the first material film for forming a crystalline oxide,
wherein a first crystalline oxide obtained by crystallizing the first material film for forming a crystalline oxide is preferentially oriented to (001).

(10) The method for manufacturing a ferroelectric film according to the above (9), wherein the first crystalline oxide is a bismuth layered-structure ferroelectric substance having a pseudo-perovskite structure or a tungsten-bronze type ferroelectric substance.

(11) The method for manufacturing a ferroelectric film according to the above (10), wherein the bismuth layered-structure ferroelectric substance is $Bi_4Ti_3O_{12}$ or $(Bi_{4-x}La_x)Ti_3O_{12}$, and x satisfies the formula below $$0<x<1.$$

(12) The method for manufacturing a ferroelectric film according to any one of the above (9) to (11), wherein:
before forming a coated film on the substrate, a second material film for forming a crystalline oxide preferentially oriented to (001) in an island shape or in a film shape is formed on the substrate;
the coated film is formed on the second material film for forming a crystalline oxide;

the ferroelectric material film, the first material film for forming a crystalline oxide and the second material film for forming a crystalline oxide are heat-treated in an oxygen atmosphere; and a second crystalline oxide obtained by crystallizing the second material film for forming a crystalline oxide is preferentially oriented to (001).

(13) A method for forming a ferroelectric film, including the steps of:

forming a first material film for forming a crystalline oxide in an island shape or in a film shape on a substrate;

forming, by coating a sol-gel solution containing K, Na and Nb on the first material film for forming a crystalline oxide by a spin-coating method, a coated film on the first material film for forming a crystalline oxide;

forming, by calcining the coated film, a ferroelectric material film on the first material film for forming a crystalline oxide;

forming a blocking film on the ferroelectric material film; and forming, by suppressing separation of K and Na from the ferroelectric material film by the blocking film while heat-treating the ferroelectric material film and the first material film for forming a crystalline oxide in an oxygen atmosphere, a ferroelectric film obtained by crystallizing the ferroelectric material film and the first material film for forming a crystalline oxide, wherein a first crystalline oxide obtained by crystallizing the first material film for forming a crystalline oxide is preferentially oriented to (001).

(14) The method for manufacturing a ferroelectric film according to any one of the above (9) to (13), wherein the total concentration of the K, Na and Nb contained in the sol-gel solution is from 10 to 50 mol %.

(15) The method for manufacturing a ferroelectric film according to any one of the above (9) to (14), wherein, by repeating twice or more the formation of the coated film and the calcination when forming the ferroelectric material film, a ferroelectric material film including a plurality of coated films is formed.

(16) The method for manufacturing a ferroelectric film according to any one of the above (9) to (15), wherein the heat treatment is carried out in a pressure range of 0.0993 to 1.986 MPa.

(17) The method for manufacturing a ferroelectric film according to any one of the above (9) to (16), wherein the ferroelectric film is a $(K_{1-x}Na_x)NbO_3$ film having a perovskite structure, and X satisfies the formula below $$0.3 \leq X \leq 0.7.$$

Effect of the Invention

According to an aspect of the present invention, a ferroelectric film formed of a lead-free material can be produced.

BEST MODE FOR CARRYING OUT THE INVENTION

Hereinafter, the embodiment of the present invention will be explained particularly using the drawings. However, a person skilled in the art would understand easily that the present invention is not limited to the explanations below, but that the form and detail thereof are changeable variously without deviating from the purport and the scope of the present invention. Accordingly, the present invention should not be construed as being limited to the described contents of the embodiment shown below.

Figure 1:
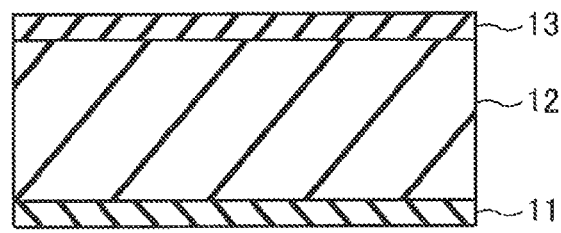
FIG. 1 is a cross-sectional view showing schematically the ferroelectric film according to an aspect of the present invention.

FIG. 1 is a cross-sectional view showing schematically the ferroelectric film according to an aspect of the present invention.

The ferroelectric film according to the present embodiment is a $(K_{1-x}Na_x)NbO_3$ film 12 having a perovskite structure, and X preferably satisfies a formula (1) below $$0.3 \leq X \leq 0.7. \tag{1}$$

Meanwhile, in the present embodiment, the $(K_{1-x}Na_x)NbO_3$ film 12 is used as a ferroelectric film, but a $BiFeO_3$ film may be used as a ferroelectric film. It is known that $BiFeO_3$ has good ferroelectric hysteresis, as was disclosed also in "Dielectric characteristics of multiferroic $BiFeO_3$ thin films," The THIRD NANO TECH CENTER SEMINAR of THE INSTITUTE OF SCIENTIFIC AND INDUSTRIAL RESEARCH, OSAKA UNIVERSITY (Prediction, formation and evaluation by nano-technology, Nov. 1, 2006), and the film can be used as a ferroelectric film formed of a lead-free material because large ferroelectricity leads to large piezoelectricity.

On at least one of the upper side and lower side of the $(K_{1-x}Na_x)NbO_3$ film 12, a crystalline oxide 11 or 13 is formed.

Figure 5:
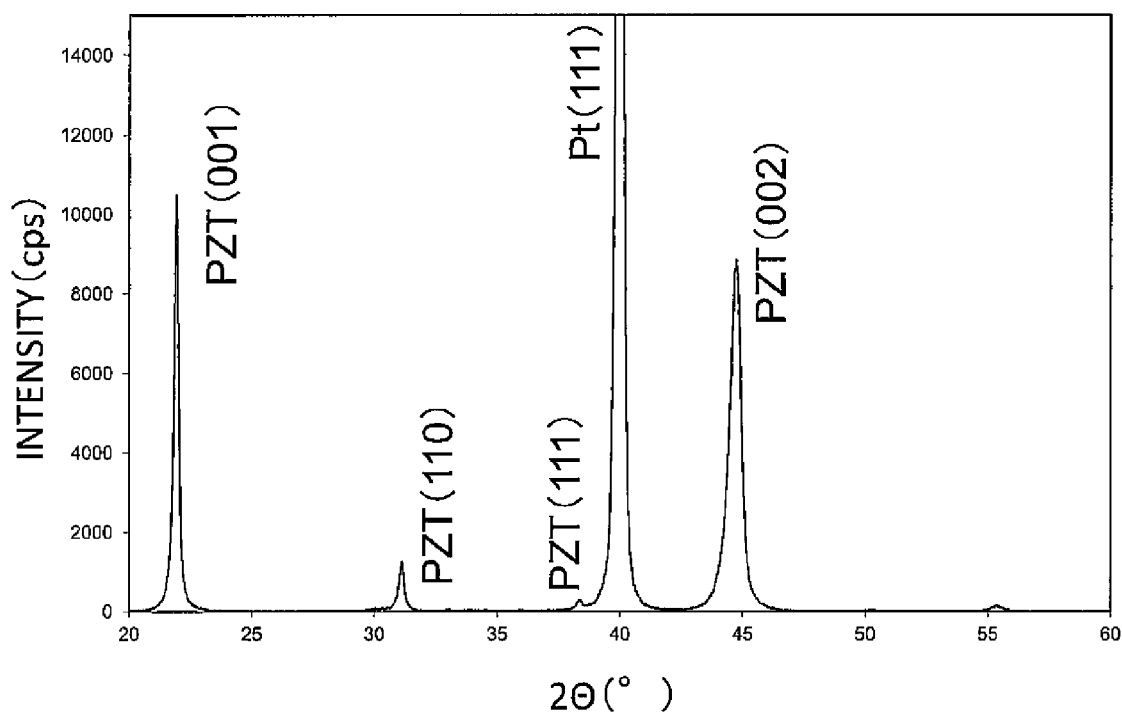
FIG. 5 is a drawing showing a representative XRD chart of c-axis oriented PZT.

The crystalline oxides 11 and 13 are preferentially oriented to (001). The preferential orientation indicates the case where the strongest peak is twice or more as compared with the second strongest peak, among respective peaks in a Θ-2Θ analysis chart when X-ray structural analysis is carried out. A specific explanation will be given using, for example, FIG. 5. However, the XRD reflection intensity on the ordinate axis in FIG. 5 is of an analog intensity representation (cps), and a logarithmic representation is not used. The next to the strongest peak (001) among respective peaks of the PZT is (110), and since there is a twice or more difference in the strength, the (001) is referred to as the preferential orientation.

By preferentially orienting the crystalline oxides 11 and 13 to (001), the $(K_{1-x}Na_x)NbO_3$ film can be oriented to (001) and as a result, piezoelectric properties can be enhanced.

The crystalline oxides 11 and 13 are each preferably a bismuth layered-structure ferroelectric substance having a pseudo-perovskite structure or a tungsten-bronze type ferroelectric substance.

It is known that the bismuth layered-structure ferroelectric substance has an anisotropic property in the crystal growth direction thereof due to a unique crystal structure thereof (paper, Takeshi Kijima et al.: Jpn. J. Appl. Phys. 35 (1996) 1246). The bismuth layered-structure ferroelectric substance has characteristics of being quickly preferentially oriented to (001) to be crystallized (characteristics of being oriented automatically to (001) that is the c-axis orientation, to be crystallized, even on a Pt film oriented to, for example, (111)), and has a crystal structure represented by a general formula $(Bi_2O_2)^{2+}(A_{m-1}B_mO_{3m+1})^{2-}$ (m=1 to 5) or $Bi_2A_{m-1}B_mO_{3m+3}$ (m=1 to 5), the structure in which a plurality of pseudo-perovskite structures is interposed between $(Bi_2O_2)^{2+}$ layers. Here, m shows the number of oxygen octahedrons in a pseudo-perovskite layer in a unit lattice. The ferroelectric substance is considered to exhibit ferroelectricity through slight rotation or inclination of the oxygen octahedron with the center of a B site ion, as in the case of a tungsten-bronze type ferroelectric substance, and has large piezoelectric anisotropy as in the case of the tungsten-bronze structure.

Figure 2:
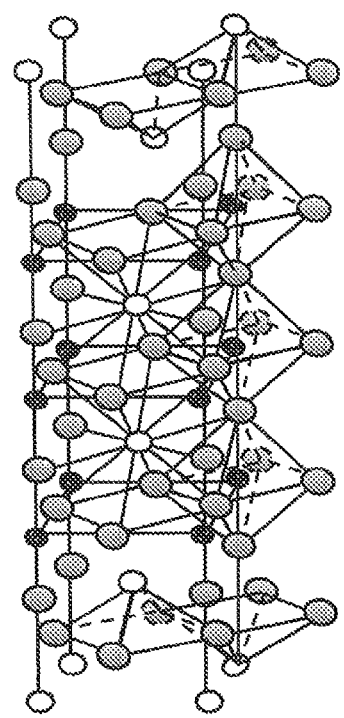
FIG. 2 is a drawing showing a crystal structure of BIT (BLT) that is a bismuth layered-structure ferroelectric substance.

As shown in FIG. 2, examples of the bismuth layered-structure ferroelectric substances include $Bi_4Ti_3O_{12}$ being BIT or $(Bi_{4-x}La_x)Ti_3O_{12}$ being BLT, and is, specifically, $(Bi_{3.25}La_{0.75})Ti_3O_{12}$. Meanwhile, x satisfies a formula below $$0 \leq x \leq 1.$$

Figure 3:
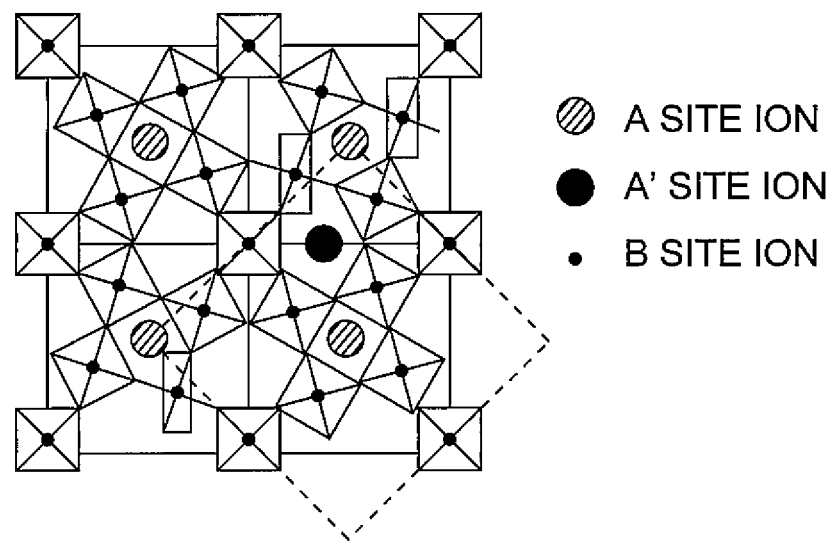
FIG. 3 is a drawing showing schematically a tungsten-bronze type crystal structure.

The crystal structure of the tungsten-bronze type ferroelectric substance is a crystal structure found through studies on sodium tungstate $(Na_xWO_3)$, x=0.0 to 1.0. The sodium tungstate takes on gold color in the composition of x=1.0, and is generally referred to as the tungsten-bronze type crystal structure. A tungsten-bronze compound has a basic structure of $A_xBO_3$ (x<1), in which a part of A site ions in the perovskite structure $ABO_3$ is lost, and is represented generally by a composition formula of a form in which the whole has been subjected to an integral multiple. In FIG. 3, a typical tungsten-bronze type crystal structure is shown. A ferroelectric substance of the present structure expresses ferroelectric properties through slight rotation or inclination of the oxygen octahedron constituted by six oxygen ions with the center of a B site ion, along with the change in an electric field. As a typical lead-free piezoelectric ceramics material of this structure, there exists $Ba_2NaNb_5O_{15}$.

Next, the method for manufacturing a ferroelectric film according to the present embodiment will be explained in detail, while referring to FIG. 1. The ferroelectric film is formed of a perovskite structure ferroelectric substance represented by $(K_{1-x}Na_x)NbO_3$, X satisfying the above formula (1).

(Substrate)

On a substrate such as, for example, a 6-inch Si wafer, a foundation film oriented in a prescribed crystalline plane is formed. As the foundation film, for example, a (111)-oriented Pt film or an Ir film is used.

Next, on the foundation film, a crystalline oxide 11 having previously been preferentially oriented to (001) plane is formed. The crystalline oxide 11 may be a crystalline oxide in an island shape or in a film shape.

Alternately, the crystalline oxide 11 may be one in which, by coating of a known sol-gel solution for forming a crystalline oxide preferentially oriented to (001) by a spin-coating method, a coated film is formed on the foundation film and by calcination of the coated film, a material film for forming a crystalline oxide, formed of the coated film is deposited on the foundation film. Meanwhile, by repeating a plurality of times the formation and calcination of the coated film, a material film for forming a crystalline oxide formed of a plurality of coated films may be deposited.

Subsequently, a sol-gel solution for forming the $(K_{1-x}Na_x)NbO_3$ film 12 is prepared. The sol-gel solution contains a raw material solution including a hetero polyacid including K, Na and Nb, polar solvents and unsaturated fatty acids. The total concentration of K, Na and Nb contained in the sol-gel solution is favorably 10 to 50 mol %.

The sol-gel solution has, as a constituent element, a hetero polyacid ion having a Keggin-type structure in which the molecular structure is caused to be noncentrosymmetric to thereby express nonlinearity, and contains, as a part of a precursor structure of ferroelectric ceramics, a hetero polyacid ion in which at least one polyatom is lost or a hetero polyacid ion in which a part of the polyatom of the hetero polyacid ion has been substituted by another atom.

The above-described hetero polyacid ion is one having a Keggin-type structure as represented by a following general formula: $[XM_yM'_{12-y}O_{40}]^{n-}$ (in the formula, X is a hetero atom, M is a polyatom, M' is a polyatom different from M, n is a valence number, and y=1 to 11), and the hetero polyacid ion is contained as a part of a precursor structure of ferroelectric ceramics.

Furthermore, the above-described hetero polyacid ion may be one having a Keggin-type structure represented by a general formula: $[XM_{11}O_{39}]^{n-}$ (in the formula, X is a hetero atom, M is a polyatom, and n is a valence number), and the hetero polyacid ion is contained as a part of a precursor structure of ferroelectric ceramics.

Moreover, the above-described hetero polyacid ion is one having a Keggin-type structure represented by a general formula: $[XM_zM'_{11-z}O_{39}]^{n-}$ (in the formula, X is a hetero atom, M is a polyatom, M' is a polyatom different from M, n is a valence number, and z=1 to 10), and the hetero polyacid ion is contained as a part of a precursor structure of ferroelectric ceramics.

In the above-described hetero polyacid ion, it is also possible for the hetero atom to be selected from a group consisting of B, Si, P, S, Ge, As, Mn, Fe and Co and for the polyatom to be selected from the group consisting of Mo, V, W, Ti, Al, Nb and Ta, and the hetero polyacid ion may be contained as a part of a precursor structure of ferroelectric ceramics.

The polar solvents are any of methyl ethyl ketone, 1,4-dioxane, 1,2-dimethoxyethane acetamide, N-methyl-2-pyrrolidone, acetonitrile, dichloromethane, nitromethane, trichloromethane, dimethylformamide, monomethylformamide or a plurality of combinations thereof.

The unsaturated fatty acid is any of mono-unsaturated fatty acids, di-unsaturated fatty acids, tri-unsaturated fatty acids, tetra-unsaturated fatty acids, penta-unsaturated fatty acids and hexa-unsaturated fatty acids or a plurality of combinations thereof.

Examples of the mono-unsaturated fatty acids include crotonic acid, myristoleic acid, palmitoleic acid, oleic acid, elaidic acid, vaccenic acid, gadoleic acid, eicosenoic acid, erucic acid and nervonic acid, and any of these or a plurality of combinations thereof may be used.

Examples of the di-unsaturated fatty acids include linoleic acid, eicosadienoic acid and docosadienoic acid, and any of these or a plurality of combinations thereof may be used.

Examples of the tri-unsaturated fatty acids include linolenic acid, pinolenic acid, eleostearic acid, Mead acid, dihomo-γ-linolenic acid and eicosatrienoic acid, and any of these or a plurality of combinations thereof may be used.

Examples of the tetra-unsaturated fatty acids include stearidonic acid, arachidonic acid, eicosatetraenoic acid and adrenic acid, and any of these or a plurality of combinations thereof may be used.

Examples of the penta-unsaturated fatty acids include bosseopentaenoic acid, eicosapentaenoic acid, osbond acid, clupanodonic acid and tetracosapentaenoic acid, and any of these or a plurality of combinations thereof may be used.

Examples of the hexa-unsaturated fatty acids include docosahexaenoic acid and nisinic acid, and any of these or a plurality of combinations thereof may be used.

Next, on the crystalline oxide 11 having previously been preferentially oriented to (001) or on the material film for forming a crystalline oxide, the sol-gel solution is coated. The result of measuring a contact angle of the sol-gel solution with the substrate gave 20° or less. Meanwhile, it suffices that the contact angle with a substrate is 1 to 40° (preferably 1 to 20°).

The coating of the sol-gel solution is carried out by a spin-coating method. Consequently, on the crystalline oxide 11 or the material film for forming a crystalline oxide, a coated film is formed, and by calcination of the coated film at a temperature of 25 to 450° C. (preferably at a temperature of 450° C.), a $(K_{1-x}Na_x)NbO_3$ material film formed of the coated film is deposited on the crystalline oxide 11 or the material film for forming a crystalline oxide. Meanwhile, by repeating the formation and calcination of the coated film a plurality of times, the $(K_{1-x}Na_x)NbO_3$ material film formed of a plurality of the coated films may be deposited on the crystalline oxide 11 or the material film for forming a crystalline oxide.

Subsequently, on the $(K_{1-x}Na_x)NbO_3$ material film, there is deposited the crystalline oxide 13 having previously been oriented to (001) or the material film for forming a crystalline oxide. As the crystalline oxide 13 or the material film for forming a crystalline oxide, there can be used the same one as the above-described crystalline oxide 11 or material film for forming a crystalline oxide.

(Crystallization Method)

By heat-treating the material film for forming a crystalline oxide, the $(K_{1-x}Na_x)NbO_3$ material film and the material film for forming a crystalline oxide in an oxygen atmosphere at a temperature of 450 to 900° C. (preferably 900° C.), these can be crystallized. As to the condition at this time, the heat treatment may be carried out in a pressure range of 0.0993 to 1.986 MPa. Furthermore, as to conditions of the heat treatment at this time, the calcination may be carried out for 1 to 5 minutes in a pressurized oxygen atmosphere of 2 to 20 atm, at a temperature rising rate of 50 to 150° C./sec. Moreover, the thickness of the $(K_{1-x}Na_x)NbO_3$ material film when crystallizing together the $(K_{1-x}Na_x)NbO_3$ material film is preferably 300 nm or more.

The crystalline oxides 11 and 13 obtained by crystallizing the material film for forming a crystalline oxide as described above are preferentially oriented to (001), and, in the crystallized $(K_{1-x}Na_x)NbO_3$ film 12, X preferably satisfies a formula (1) below $$0.3 \leq X \leq 0.7. \quad (1)$$

The $(K_{1-x}Na_x)NbO_3$ film 12 scarcely contains an air bubble even if it is a thick film with a thickness of 500 nm or more. In other words, by depositing a film according to this procedure, an excellent thick film can be formed. The reason is that the film is formed of a structure in which organic components disappear almost in the thickness direction, the film scarcely shrinks in the substrate surface, and the shrinkage is to the extent of being compensated by expansion due to oxidation. Accordingly, the substrate scarcely exhibits warpage.

Meanwhile, by repeating the formation and crystallization of the $(K_{1-x}Na_x)NbO_3$ material film, it is also possible to form the $(K_{1-x}Na_x)NbO_3$ film 12 with a thickness of 2 μm or more.

Furthermore, the total thickness of the crystalline oxides 11 and 13 crystallized as described above is 1 to 30 nm, preferably 15 to 25 nm, and more preferably 20 nm.

Meanwhile, in FIG. 1, the crystalline oxides 11 and 13 are formed on both the upper side and lower side of the ferroelectric film 12, respectively, but the crystalline oxide may be formed on at least one of the upper side and lower side of the ferroelectric film 12. When the crystalline oxide is formed only on one of the upper side and lower side of the ferroelectric film, the thickness of the crystalline oxide on one side is 1 to 30 nm, preferably 15 to 25 nm, and more preferably 20 nm.

The crystal in the crystalline oxides 11 and 13 serves as a nucleus when crystallizing the $(K_{1-x}Na_x)NbO_3$ material film, and thus it becomes possible to proceed promptly with the crystallization of the $(K_{1-x}Na_x)NbO_3$ material film that is difficult to be crystallized into the perovskite structure. Since the crystalline oxides 11 and 13 act as the nucleus in the crystallization in this way, it suffices that the crystalline oxide has been formed on at least one of the $(K_{1-x}Na_x)NbO_3$ material film.

When forming the crystalline oxide 11 only on the lower side of the $(K_{1-x}Na_x)NbO_3$ material film, favorably a blocking film is formed on the upper side of the $(K_{1-x}Na_x)NbO_3$ material film. Various blocking films can be used as long as they function in order to suppress the separation of K and Na from the $(K_{1-x}Na_x)NbO_3$ material film when the $(K_{1-x}Na_x)NbO_3$ material film is heat-treated in an oxygen atmosphere and is crystallized.

Furthermore, the crystalline oxides 11 and 13 have preferably higher dielectric constant than the $(K_{1-x}Na_x)NbO_3$ film 12 being a ferroelectric film. The "higher dielectric constant" referred to here means that the whole dielectric constant of the crystalline oxides 11 and 13 is higher than the whole dielectric constant of the ferroelectric film 12, that is, it means so-called real dielectric constant. Consequently, when a voltage is applied serially to the crystalline oxides 11 and 13, and the $(K_{1-x}Na_x)NbO_3$ film 12, an electric field is added to the $(K_{1-x}Na_x)NbO_3$ film 12 having lower dielectric constant.

According to the present embodiment, the $(K_{1-x}Na_x)NbO_3$ film 12 that is a ferroelectric film formed of a lead-free material, can be produced.

In addition, in the present embodiment, by using the crystalline oxides 11 and 13 preferentially oriented to (001), a $(K_{1-x}Na_x)NbO_3$ film can be crystallized, oriented to (001), and as a result, piezoelectric properties of the $(K_{1-x}Na_x)NbO_3$ film can be enhanced.

Furthermore, according to the present embodiment, since the heat treatment for the crystallization is carried out in a state where the $(K_{1-x}Na_x)NbO_3$ material film is sandwiched between the crystalline oxide 11 and the crystalline oxide 13, it is possible to suppress the escape of K and Na in the $(K_{1-x}Na_x)NbO_3$ material film and it is possible to improve film properties of the crystallized $(K_{1-x}Na_x)NbO_3$ film 12.

Moreover, by adopting a pressurized oxygen atmosphere when carrying out the heat treatment for crystallizing the $(K_{1-x}Na_x)NbO_3$ material film, it is possible to suppress the escape of K and Na in the $(K_{1-x}Na_x)NbO_3$ material film and it is possible to improve film properties of the crystallized $(K_{1-x}Na_x)NbO_3$ film 12.

In addition, the crystalline oxides 11 and 13 may be removed after crystallizing the $(K_{1-x}Na_x)NbO_3$ material film. As the removal method for example, an etching method is used.

Furthermore, in the present embodiment, as shown in FIG. 1, there is formed a ferroelectric film in which the crystalline oxide 11, the $(K_{1-x}Na_x)NbO_3$ film 12 and the crystalline oxide 13 are stacked in this order, but there may also be stacked a plurality of ferroelectric films that includes the $(K_{1-x}Na_x)NbO_3$ film 12, and the crystalline oxide 11 formed on at least one of the upper side and lower side thereof.

EXAMPLE

A Ti film of 10 to 30 nm is formed on a 6-inch Si wafer via a silicon oxide film by a sputtering method. Particularly, the Ti film was formed by an RF sputtering method. The Ti film serves as an adhesive layer of platinum and silicon oxide. The Ti film was formed under conditions such as argon gas pressure of 0.2 Pa, power output of 0.12 kW and deposition time of 20 minutes. The film formation was carried out at substrate temperature of 200° C.

Next, the Ti film is subjected to a heat treatment at a temperature of 650° C. for 5 minutes, by RTA (Rapid Thermal Anneal). The treatment was carried out in an oxygen atmosphere at 9.9 atm and at 100° C./sec.

Then, on the Ti film, a first Pt film of 100 nm is deposited by a sputtering method at a temperature of 550 to 650° C. The deposition was carried out at argon gas pressure of 0.4 Pa, at an output power of DC power of 100 W and for a deposition time of 25 minutes.

Subsequently, on the first Pt film, a second Pt film of 100 nm is deposited by an evaporation method at ordinary temperature. The deposition was carried out at $3.3 \times 10^{-3}$ Torr, at an output power of 10 kV, and for a deposition time of 4 minutes.

After that, the Si wafer is subjected to a heat treatment by RTA, at a temperature of 650 to 750° C. for 1 to 5 minutes. As described above, a 6-inch Si wafer, on the surface of which a (111)-oriented Pt film is formed, is prepared.

Next, a material film of $Bi_4Ti_3O_{12}$ $(Bi_{3.25}La_{0.75})Ti_3O_{12}$ for forming a crystalline oxide preferentially oriented to (001) on the Si wafer is deposited. The deposition conditions at this time are as follows.

As a sol-gel solution for forming a material film of $Bi_4Ti_3O_{12}$ or $(Bi_{3.25}La_{0.75})Ti_3O_{12}$, there was used a sol-gel solution with a concentration of 8% by weight, in which metal elements were mixed at Bi:La:Ti=3.65:0.75:3 with 10% excessive Bi using n-butanol as a solvent, manufactured by TOSHIMA MFG Co., Ltd. Using the present solution, spin-coating formation of the material film of $Bi_4Ti_3O_{12}$ or $(Bi_{3.25}La_{0.75})Ti_3O_{12}$ was carried out. As a spin coater, MS-A200 manufactured by MIKASA CO., LTD was used. First, after the spin coater was rotated at 300 rpm for 5 seconds and at 2000 rpm for 30 to 60 seconds, the rotation rate was gradually raised up to 3000 rpm and was kept for 10 seconds. Subsequently, the spin-coated wafer was left on a hot plate (ceramic hot plate AHS-300, manufactured by AS ONE Corporation) at 200° C. for 0.5 minutes in the air, then the wafer was left on a hot plate (similarly AHS-300) at 450° C. for 1 minute similarly in the air, and after that, the wafer was cooled to room temperature. As described above, the material film of $Bi_4Ti_3O_{12}$ or $(Bi_{3.25}La_{0.75})Ti_3O_{12}$ with a thickness of 20 nm was formed on the Si wafer.

Next, there is prepared a sol-gel solution, the contact angle of which with above-described material film of $Bi_4Ti_3O_{12}$ or $(Bi_{3.25}La_{0.75})Ti_3O_{12}$ is 40° or less, preferably 20° or less. Particularly, the sol-gel solution contains a raw material solution including a hetero polyacid including K, Na and Nb, polar solvents and unsaturated fatty acids.

A raw material solution for forming the $(K_{1-x}Na_x)NbO_3$ film is formed of being mixed with a hetero polyacid that is a polyacid of a $(X_lM_mO_n)^{x-}$ type with a hetero atom inserted in a metal oxygen acid skeleton. The raw material solution is a sol-gel solution for forming an oxide film, in which the polyatom is formed of M=Mo, V, W, Ti, Al, Nb and Ta, and a hetero atom means elements other than H and C, and which is preferably formed of M=B, Si, P, S, Ge, As, Fe, Co and Bi.

Polar solvents are any of methyl ethyl ketone, 1,4-dioxane, 1,2-dimethoxyethane acetamide, N-methyl-2-pyrrolidone, acetonitrile, dichloromethane, nitromethane, trichloromethane, dimethylformamide and monomethylformamide, or a plurality of combinations thereof.

Regarding unsaturated fatty acids, examples of mono-unsaturated fatty acids include crotonic acid, myristoleic acid, palmitoleic acid, oleic acid, elaidic acid, vaccenic acid, gadoleic acid, eicosenoic acid, erucic acid and nervonic acid, examples of di-unsaturated fatty acids include linoleic acid, eicosadienoic acid and docosadienoic acid, examples of tri-unsaturated fatty acids include linolenic acid, pinolenic acid, eleostearic acid, Mead acid, dihomo-γ-linolenic acid and eicosatrienoic acid, examples of tetra-unsaturated fatty acids include stearidonic acid, arachidonic acid, eicosatetraenoic acid and adrenic acid, examples of penta-unsaturated fatty acids include bosseopentaenoic acid, eicosapentaenoic acid, osbond acid, clupanodonic acid and tetracosapentaenoic acid, and examples of hexa-unsaturated fatty acids include docosahexaenoic acid and nisinic acid.

Next, by coating the sol-gel solution on the material film of $Bi_4Ti_3O_{12}$ or $(Bi_{3.25}La_{0.75})Ti_3O_{12}$ by a spin-coating method, a coated film of a first layer is formed on the material film of the $Bi_4Ti_3O_{12}$ or $(Bi_{3.25}La_{0.75})Ti_3O_{12}$. Particularly, the sol-gel solution of 500 μL was coated, raised from 0 to 500 rpm in 3 seconds, held at 500 rpm for 3 seconds, then rotated at 2000 rpm for 60 seconds, and after that, stopped.

Subsequently, the coated film of the first layer is heated with a hot plate at a temperature of 200° C. for 1 minute, and then, is calcined at a temperature of 450° C. for 1 minute. Consequently, on the material film of $Bi_4Ti_3O_{12}$ or $(Bi_{3.25}La_{0.75})Ti_3O_{12}$, a ferroelectric material amorphous film of a first layer with a thickness of 125 nm is formed.

After that, in the same way as that for the coated film of the first layer, on the ferroelectric material film of the first layer, a coated film of a second layer is formed. Subsequently, in the same way as that for the coated film of the first layer, the coated film of the second layer is heated and calcined. Consequently, on the ferroelectric material film of the first layer, the ferroelectric material film of the second layer with a thickness of 125 nm is formed.

Next, in the same way as that for the coated film of the second layer, on the ferroelectric material film of the second layer, a coated film of a third layer is formed. Then, in the same manner as that for the coated film of the first layer, the coated film of the third layer is heated and calcined. Consequently, on the ferroelectric material film of the second layer, the ferroelectric material film of the third layer with thickness of 125 nm is formed. The repetition of this forms a ferroelectric material film of twelve layers. As described above, the ferroelectric material film formed of twelve layers with a thickness of 1.5 μm can be deposited.

Subsequently, on the ferroelectric material film, the material film of $Bi_4Ti_3O_{12}$ or $(Bi_{3.25}La_{0.75})Ti_3O_{12}$ for forming a crystalline oxide preferentially oriented to (001) is deposited. Conditions for depositing the film at this time are the same as those for above-described material film of $Bi_4Ti_3O_{12}$ or $(Bi_{3.25}La_{0.75})Ti_3O_{12}$.

Next, by subjecting the ferroelectric material film, and the material film of $Bi_4Ti_3O_{12}$ or $(Bi_{3.25}La_{0.75})Ti_3O_{12}$ to a heat treatment by pressurized RTA, the crystallization of these films forms a $(K_{1-x}Na_x)NbO_3$ film being a ferroelectric film and a crystallized film of $Bi_4Ti_3O_{12}$ or $(Bi_{3.25}La_{0.75})Ti_3O_{12}$ having been preferentially oriented to (001). As to heat treatment conditions at this time, the crystallization was carried out at a temperature rising rate of 100° C./sec up to 900° C. instantly in an oxygen atmosphere pressurized at an oxygen partial pressure of 9.9 atm, and by holding the temperature for one minute.

Meanwhile, in the present Example, the ferroelectric film of 1.5 μm is formed, but a ferroelectric film with thicker thickness or a ferroelectric film with thinner thickness may by formed.

Figure 4:
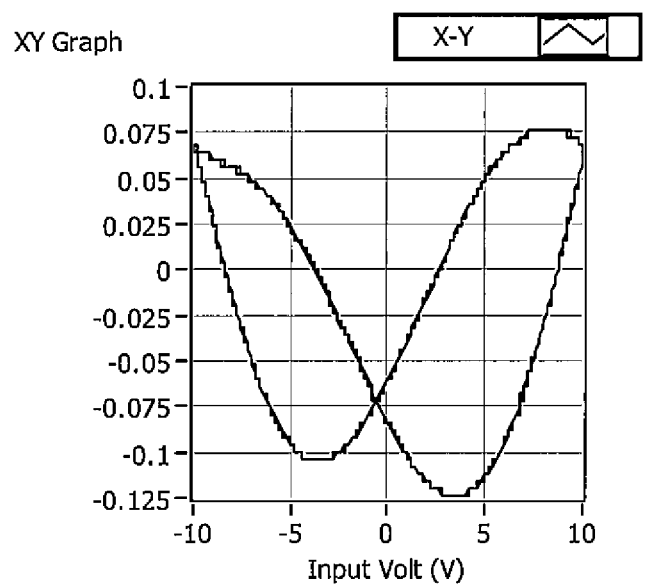
FIG. 4 is a characteristic view showing the result of an evaluation of the ferroelectric film that is a sample 1.

FIG. 4 is a characteristic view showing the result of evaluating the ferroelectric film of a sample 1. Meanwhile, the abscissa axis in FIG. 4 represents the applied voltage (Volts), and the ordinate axis in FIG. 4 represents displacement (%).

FIG. 4 shows the result of performing the evaluation by driving the ferroelectric film through the use of a bipolar pulse of ±10 V at a frequency of 700 Hz. As shown in FIG. 4, the ferroelectric film of the sample 1 was confirmed to have excellent piezoelectric properties.

REFERENCE SIGNS LIST

11: crystalline oxide
12: $(K_{1-x}Na_x)NbO_3$ film (ferroelectric film)
13: crystalline oxide

The invention claimed is:

1. A ferroelectric film comprising:
   a $(K_{1-x}Na_x)NbO_3$ film or a $BiFeO_3$ film having a perovskite structure; and
   a crystalline oxide preferentially oriented to (001), formed on at least one of an upper side and lower side of said $(K_{1-x}Na_x)NbO_3$ film or $BiFeO_3$ film,
   wherein said crystalline oxide is a bismuth layered-structure ferroelectric substance having a pseudo-perovskite structure or a tungsten-bronze type ferroelectric substance,
   wherein said bismuth layered-structure ferroelectric substance is $(Bi_2O_2)^{2+}(A_{m-1}B_mO_{3+1})^{2-}$ (m=1 to 5) or $Bi_2A_{m-1}B_mO_{3m+3}$ (m=1 to 5), and
   wherein X satisfies the formula below $0.3 \leq X \leq 0.7$.

2. The ferroelectric film according to claim 1,
   wherein said crystalline oxide is formed in an island shape or in a film shape.
3. The ferroelectric film according to claim 1,
   wherein a thickness of said crystalline oxide is 2 to 30 nm.
4. The ferroelectric film according to claim 1,
   wherein said $(K_{1-x}Na_x)NbO_3$ film or $BiFeO_3$ film is formed by a sol-gel method.

5. The ferroelectric film according to claim 1,
   wherein a ferroelectric film including said $(K_{1-x}Na_x)NbO_3$ film or $BiFeO_3$ film, and said crystalline oxide formed on at least one of the upper side and lower side thereof is stacked.

6. A ferroelectric film comprising:
   a $(K_{1-x}Na_x)NbO_3$ film or a $BiFeO_3$ film having a perovskite structure; and
   a crystalline oxide preferentially oriented to (001), formed on at least one of an upper side and lower side of said $(K_{1-x}Na_x)NbO_3$ film or $BiFeO_3$ film,
   wherein said crystalline oxide is a tungsten-bronze type ferroelectric substance, and
   wherein X satisfies the formula below $0.3<X<0.7$.

7. The ferroelectric film according to claim 6,
   wherein said crystalline oxide is formed in an island shape or in a film shape.
8. The ferroelectric film according to claim 6,
   wherein a thickness of said crystalline oxide is 2 to 30 nm.
9. The ferroelectric film according to claim 6,
   wherein said $(K_{1-x}Na_x)NbO_3$ film or $BiFeO_3$ film is formed by a sol-gel method.
10. The ferroelectric film according to claim 6,
    wherein a ferroelectric film including said $(K_{1-x}Na_x)NbO_3$ film or $BiFeO_3$ film, and said crystalline oxide formed on at least one of the upper side and lower side thereof is stacked.

11. A ferroelectric film comprising:
    a $(K_{1-x}Na_x)NbO_3$ film or a $BiFeO_3$ film having a perovskite structure; and
    a crystalline oxide preferentially oriented to (001), formed on at least one of an upper side and lower side of said $(K_{1-x}Na_x)NbO_3$ film or a $BiFeO_3$ film,
    wherein X satisfies the formula below $0.3<X<0.7$, wherein said crystalline oxide is a bismuth layered-structure ferroelectric substance having a pseudo-perovskite structure or a tungsten-bronze type ferroelectric substance, and
    wherein said bismuth layered-structure ferroelectric substance is $Bi_4Ti_3O_{12}$ or $(Bi_{4-x}La_x)Ti_3O_{12}$, and x satisfies the formula below $0<x<1$.

12. The ferroelectric film according to claim 11,
    wherein said crystalline oxide is formed in an island shape or in a film shape.
13. The ferroelectric film according to claim 11,
    wherein a thickness of said crystalline oxide is 2 to 30 nm.
14. The ferroelectric film according to claim 11,
    wherein said $(K_{1-x}Na_x)NbO_3$ film or $BiFeO_3$ film is formed by a sol-gel method.
15. The ferroelectric film according to claim 11,
    wherein a ferroelectric film including said $(K_{1-x}Na_x)NbO_3$ film or $BiFeO_3$ film, and said crystalline oxide formed on at least one of the upper side and lower side thereof is stacked.

* * * * *